US008170359B2

(12) United States Patent
Tanaka

(10) Patent No.: US 8,170,359 B2
(45) Date of Patent: May 1, 2012

(54) ENCODING DEVICE AND ENCODING METHOD

(75) Inventor: Toshihiro Tanaka, Hyogo (JP)

(73) Assignee: Panasonic Corporation, Osaka (JP)

( * ) Notice: Subject to any disclaimer, the term of this patent is extended or adjusted under 35 U.S.C. 154(b) by 682 days.

(21) Appl. No.: 12/439,021

(22) PCT Filed: Oct. 16, 2007

(86) PCT No.: PCT/JP2007/070156
§ 371 (c)(1),
(2), (4) Date: Feb. 26, 2009

(87) PCT Pub. No.: WO2008/065822
PCT Pub. Date: Jun. 5, 2008

(65) Prior Publication Data
US 2009/0263036 A1 Oct. 22, 2009

(30) Foreign Application Priority Data

Nov. 28, 2006 (JP) ................................. 2006-319981

(51) Int. Cl.
*G06K 9/36* (2006.01)
(52) U.S. Cl. ........................................ 382/251; 382/232
(58) Field of Classification Search .................. 382/232, 382/233, 247, 251; 375/240.03
See application file for complete search history.

(56) References Cited

U.S. PATENT DOCUMENTS

| 5,410,352 A | 4/1995 | Watanabe |
| 5,870,145 A | 2/1999 | Yada et al. |
| 6,850,175 B1 | 2/2005 | Bossen |
| 7,796,690 B2 | 9/2010 | Yagasaki et al. |
| 2002/0114527 A1 | 8/2002 | Horie |
| 2002/0114529 A1 | 8/2002 | Horie |
| 2005/0129320 A1 | 6/2005 | Koto |
| 2005/0156762 A1 | 7/2005 | Tsuru |
| 2005/0180505 A1 | 8/2005 | Ogawa et al. |
| 2005/0243930 A1 | 11/2005 | Asano et al. |
| 2005/0249289 A1 | 11/2005 | Yagasaki et al. |
| 2006/0176953 A1 | 8/2006 | Mohsenian |

(Continued)

FOREIGN PATENT DOCUMENTS

JP 5-252403 A 9/1993

(Continued)

OTHER PUBLICATIONS

Search report from E.P.O. that issued with respect to patent family member European Patent Application No. 07829890.8, mail date is Aug. 8, 2011.

(Continued)

*Primary Examiner* — Duy M Dang
(74) *Attorney, Agent, or Firm* — Greenblum & Bernstein, P.L.C.

(57) ABSTRACT

An encoding device 100 includes a quantization parameter generating circuit 111 that generates a provisional quantization parameter, a quantizing circuit 121 that generates quantized data by quantizing a signal to be quantized on the basis of the provisional quantization parameter, a binarizing circuit 131 that binarizes the quantized data to output binary symbol data, an arithmetic coding circuit 141 that generates coded data by arithmetic-coding the binary symbol data, a quantization parameter calculating circuit 112 that generates a suitable quantization parameter on the basis of a symbol amount of the binary symbol data, a code amount of the coded data, an upper limit of the symbol amount, and an target code amount, a quantizing circuit 122 that quantizes the signal to be quantized on the basis of the suitable quantization parameter.

9 Claims, 10 Drawing Sheets

U.S. PATENT DOCUMENTS

| | | |
|---|---|---|
| 2006/0239348 A1 | 10/2006 | Zhang et al. |
| 2007/0033019 A1 | 2/2007 | Yasunaga et al. |
| 2007/0100613 A1 | 5/2007 | Yasunaga et al. |
| 2007/0255558 A1 | 11/2007 | Yasunaga et al. |
| 2008/0275698 A1 | 11/2008 | Yasunaga et al. |
| 2009/0012781 A1 | 1/2009 | Yasunaga et al. |
| 2010/0329330 A1 | 12/2010 | Yagasaki et al. |
| 2010/0329331 A1 | 12/2010 | Yagasaki et al. |
| 2010/0329351 A1 | 12/2010 | Yagasaki et al. |
| 2011/0007818 A1 | 1/2011 | Yagasaki et al. |
| 2011/0044387 A1 | 2/2011 | Yagasaki et al. |

FOREIGN PATENT DOCUMENTS

| | | |
|---|---|---|
| JP | 2003-18593 A | 1/2003 |
| JP | 2004-135251 A | 4/2004 |
| JP | 2004-135252 A | 4/2004 |
| JP | 2005-151391 A | 6/2005 |
| JP | 2005-184232 A | 7/2005 |
| JP | 2005-203905 A | 7/2005 |
| JP | 2005-252374 A | 9/2005 |
| JP | 2005-318296 A | 11/2005 |
| WO | 96/28937 | 9/1996 |
| WO | 2004/028165 | 4/2004 |
| WO | 2004/034330 | 4/2004 |

OTHER PUBLICATIONS

English language abstract of JP 2005-252374 A, Sep. 15, 2005.
English language abstract of JP 2004-135251 A, Apr. 30, 2004.
English language abstract of JP 5-252403 A, Sep. 28, 1993.
ITU-T Recommendation H.264, "Series H: Audiovisual and Multimedia Systems, Infrastructure of audiovisual services—Coding of moving video, Advanced video coding for generic audiovisual services," Nov. 2007.
U.S. Appl. No. 12/439,004 to Tanaka, which was filed on Feb. 26, 2009.
English language abstract of JP 2005-184232 A, Jul. 7, 2005.
English language abstract of JP 2004-135252 A, Apr. 30, 2004.
English language abstract of JP 2005-151391 A, Jun. 9, 2005.
English language abstract of JP 2003-18593 A, Jan. 17, 2003.
English language abstract of JP 2005-318296 A, Nov. 10, 2005.
English language abstract of JP 2005-203905 A, Jul. 28, 2005.
Yamakage et al., "HD DVD ni Mochiru Dogazo Fugoka Gijutsu", Toshiba Review, vol. 60, No. 1, Jan. 1, 2005, pp. 17-20.

Fig.3A

CASE OF NORMAL RASTER SCAN
(PROGRESSIVE)

| 0 | 20 | 0 | 20 | 0 | 20 | 0 | 20 | → LINE 1 |
|---|----|---|----|---|----|---|----|----------|
| 20 | 0 | 20 | 0 | 20 | 0 | 20 | 0 | → LINE 2 |
| 0 | 20 | 0 | 20 | 0 | 20 | 0 | 20 | |
| 20 | 0 | 20 | 0 | 20 | 0 | 20 | 0 | |
|  |  |  |  |  |  |  |  | |

Fig.3B

CASE OF PAIRING MACRO BLOCKS
(INTERLACE)

| | 0 | 20 | 0 | 20 | 0 | 20 | 0 | 20 | LINE 1 |
|---|---|----|---|----|---|----|---|----|--------|
| PAIR | 0 | 20 | 0 | 20 | 0 | 20 | 0 | 20 | |
| | 20 | 0 | 20 | 0 | 20 | 0 | 20 | 0 | LINE 2 |
| | 20 | 0 | 20 | 0 | 20 | 0 | 20 | 0 | |
|  |  |  |  |  |  |  |  |  | |

*Fig.4A*

QUANTIZATION PARAMETER QP : $0 \leq QP \leq 51$
NUMBER OF REPRESENTATIVE QUANTIZATION PARAMETERS Q=10

$qP_1(x) = \{0, 4, 8, 12, 16, 22, 28, 34, 42, 51\}$
$QP_1(n) \in qP_1(x) \quad 0 \leq n \leq 2039, \quad 0 \leq x \leq 9$

*Fig.4B*

CASE OF NORMAL RASTER SCAN
(PROGRESSIVE)
$QP_1(n)$

| 0 | 4 | 8 | 12 | 16 | 22 | 28 | 34 | 42 | 51 | 0 | → LINE 1 |
|---|---|---|----|----|----|----|----|----|----|---|---|
| 34 | 42 | 51 | 0 | 4 | 8 | 12 | 16 | 22 | 28 | 34 | → LINE 2 |
| 16 | 22 | 28 | 34 | 42 | 51 | 0 | 4 | 8 | 12 | 16 | |
| 4 | 8 | 12 | 16 | 22 | 28 | 34 | 42 | 51 | 0 | 4 | |

*Fig.4C*

CASE OF PAIRING MACRO BLOCKS
(INTERLACE)
PAIR  $QP_1(n)$

| 0 | 4 | 8 | 12 | 16 | 22 | 28 | 34 | 42 | 51 | 0 |
|---|---|---|----|----|----|----|----|----|----|---|
| 0 | 4 | 8 | 12 | 16 | 22 | 28 | 34 | 42 | 51 | 0 |
| 34 | 42 | 51 | 0 | 4 | 8 | 12 | 16 | 22 | 28 | 34 |
| 34 | 42 | 51 | 0 | 4 | 8 | 12 | 16 | 22 | 28 | 34 |

Rows 1-2: LINE 1; Rows 3-4: LINE 2

Fig. 5A $qp_1(x) = \{0, 4, 8, 12, 16, 22, 28, 34, 42, 51\}$ $0 \leq x \leq 9$ (TEN TYPES)

$QP_1(n) \in qp_1(x)$  $0 \leq n \leq 2039$, $0 \leq x \leq 9$

Fig. 5B

EVERY-QP GENERATED BINARY SYMBOL AMOUNT :
$b_1(x) = \{148376, 127006, 89932, 62323, 38851, 23482, 12323, 6196, 2321, 1293\}$

EVERY-QP GENERATED CODE AMOUNT :
$r_1(x) = \{95626, 82252, 64551, 48648, 31785, 19098, 10373, 5439, 2259, 1261\}$

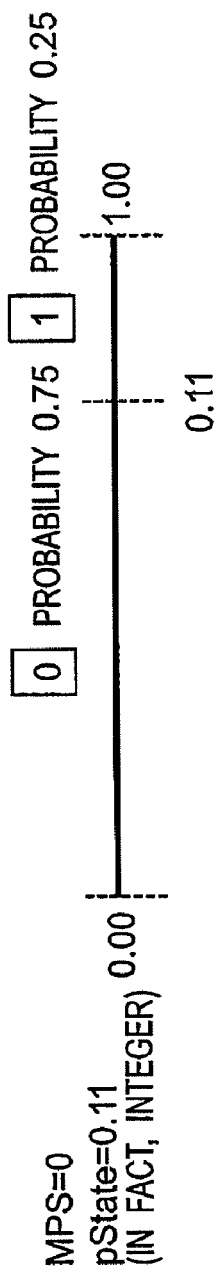
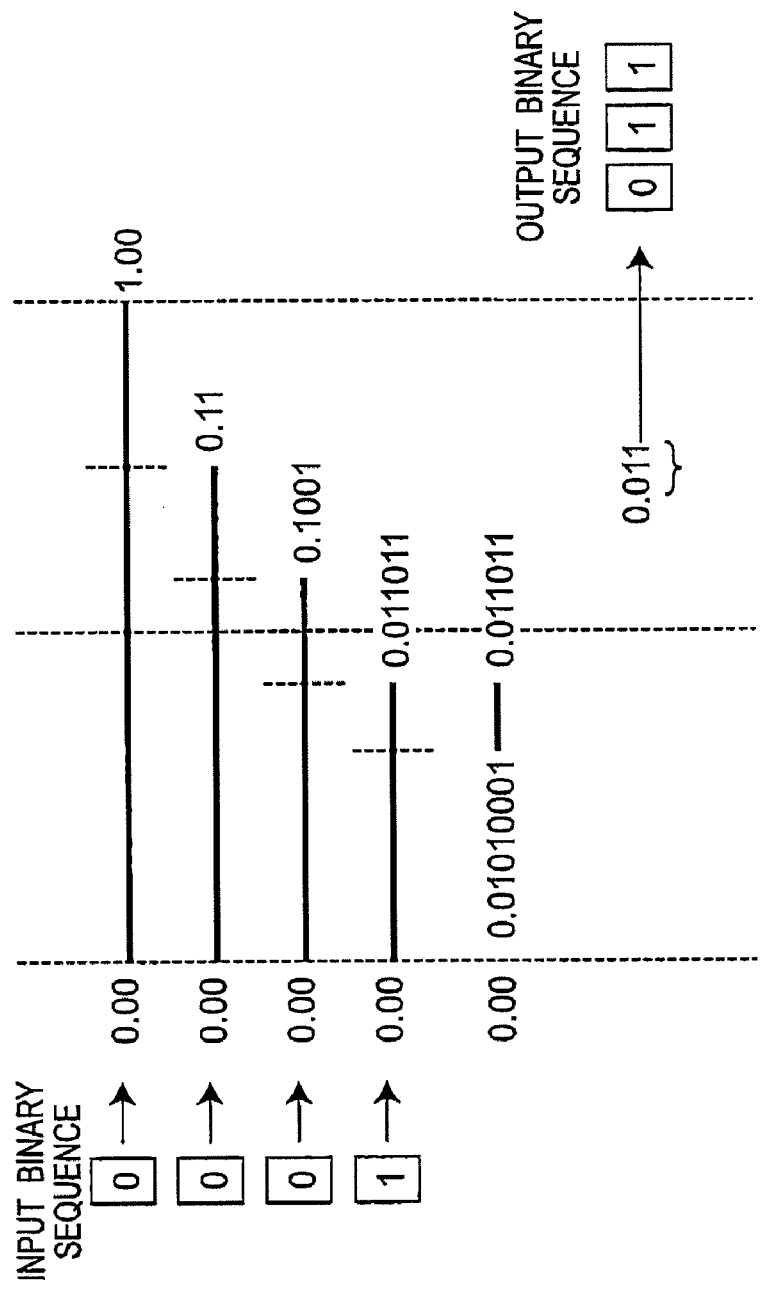
Fig. 10A
Fig. 10B

ENCODING DEVICE AND ENCODING METHOD

TECHNICAL FIELD

The present invention relates to an encoding device and an encoding method, and more particularly to an encoding device and an encoding method applying arithmetic coding.

BACKGROUND ART

Arithmetic coding is a technology capable of reversibly compressing the quantity of information up to a theoretical limit depending on the occurrence probability of information source symbols. Arithmetic coding is applied, in the image coding fields, to JPEG2000 standard (ISO/IEC15444), H.264/MPEG4-AVC standard (see, for example, non-patent document 1), and others.

For example, in H.264, Context Adaptive Binary Arithmetic Coding (CABAC) is applied, and coding of high efficiency is realized depending on the probability characteristic of syntax.

Context Adaptive Binary Arithmetic Coding in H.264 is explained. FIG. 9 shows a conventional context adaptive binary arithmetic coding circuit.

In a context adaptive binary arithmetic coding circuit 14 in FIG. 9, a binarizing circuit 130 binarizes multivalued input data composed of conversion coefficient data, flags and other coding information. Binarization is performed by judging the syntax element showing the type of the input data from the control information, and using properly a plurality of methods such as an unary binarization and a fixed-length binarization depending on the data probability characteristic. Binary symbol (binary) sequences binarized by the binarizing circuit 130 are entered into a (binary) arithmetic coding circuit 140.

A context calculation circuit 520 determines uniformly the value of context index (ctxIdx) used in coding of present 1 bit in the binary symbol sequence on the basis of the control information showing the syntax element, by referring to a table determined in the H.264 standard. The context calculation circuit 520 initializes and stores occurrence probability information in every value of ctxIdx. The occurrence probability information is a set of MPS showing the symbol of the higher occurrence probability of binary symbol 0 or 1 and occurrence probability pState. The occurrence probability information corresponding to the determined ctxIdx value is called the "context information".

The context calculation circuit 520 generates context information 504, and outputs it to the arithmetic coding circuit 140. Thus, depending on the syntax element for arithmetic coding, the symbol occurrence probability or the context information 504 to be entered in the arithmetic coding circuit 140 is changed over adaptively, and the optimum arithmetic coding become possible for the binary symbol sequence 503 in which the occurrence probability of a binary symbol is changed dynamically.

In the following explanation, the total bit length (symbol length) of binary symbol sequence is called the "symbol amount", and the total bit length of output code after arithmetic coding is called the "code amount", and in particular, the total bit length of binary symbol sequence generated when multivalued input data of a specific section is processed is called the "generated binary symbol amount", and the total bit length of output codes is called the "generated code amount".

The operation of the arithmetic coding circuit 140 is explained by referring to FIGS. 10A and 10B. In FIGS. 10R and 10B, suppose that the binary sequence of {0,0,0,1} are supplied from the information source of which the occurrence probability of symbol "0" is 0.75 (0.11 in binary notation), and the occurrence probability of symbol "1" is 0.25. In this case, the present context information 504 is expressed by MPS showing the symbol of higher occurrence probability=0, and occurrence probability pState=0.11 (see FIG. 10A). Indeed, the occurrence probability pState is expressed by a normalized integer value, but a binary value is used herein for the sake of simplicity. The context information 504 is updated by this binary arithmetic coding, and is returned to the context calculation circuit 520. In the context calculation circuit 520, the occurrence probability information of the corresponding ctxIdx is updated. This value is utilized again in the next coding process of the same context.

Referring now to FIG. 10B, when a first input binary value "0" is entered, the section of [0, 1] is narrowed to the 0 side divided by probability 0.11, and becomes [0, 0.11]. When a second input "0" is entered, the section of [0, 0.11] is narrowed to [0, 0.1001]. Herein, 0.1001=0.11×0.11. Similarly, by a third input "0", the section becomes [0, 0.011011]. When a fourth input "1" is entered, the section is narrowed to the 1 side. The final section is [0.01010001, 0.011011]. Of the values contained in this final section, the one having the shortest word length is the code word. That is, since 0.011 is contained in this section, the value "011" below the decimal point is an output binary sequence, and the four-bit input value is compressed to 3 bits. Actually, on the moment of establishment of output bit (0 or 1), the process called renormalization for left-bit shift of probability value is executed.

On the other hand, in moving image coding, in order to maxdiize the image quality in specific bit rate condition, it is necessary to control the code amount by appropriately controlling the quantization parameters when coding each macro block. To enhance the precision of control of code amount, it is general to code repeatedly by changing the parameters in the unit of slice, frame, or GOP (group of pictures).

Patent document 1: JP-A-2004-135251

Non-patent document 1: ISO/IEC14496-10 Advanced video coding for generic audiovisual services

DISCLOSURE OF INVENTION

Problems to be Solved by the Invention

In the case of configuration of coding circuit by using arithmetic coding, from the purpose of defining the maximum processing quantity in the decoder, an upper limit of binary symbol amount (BinCountsInNALunits) is defined (see non-patent document 1). To conform to the definition of the upper limit, it is necessary to control the code amount and the binary symbol amount. By this definition of the upper limit, the upper limit of the operation time of the circuit can be defined. For example, in patent document 1, a limit monitor device of binary symbol amount to be entered in the arithmetic encoding device is prepared, and if exceeding the threshold, coding is done again, or by coding with the use of a plurality of parallel coding parameters, the binary symbol amount is controlled.

When coding again, as mentioned above, the updated occurrence probability information of arithmetic coding must be returned to the original information, and in the encoding device in which the real-time processing is demanded, a complicated circuit configuration is required. Or when coding by using a plurality of parallel coding parameters, the arithmetic coding circuits are required as many as the number of coding parameters, and the circuit scale is inch increased.

The invention is conceived in the light of the above problems, and it is hence an object thereof to present an encoding device using arithmetic coding, simple in circuit configuration, capable of coding in which the decoding operation is assured while controlling the binary symbol amount within the upper limit, and realizing the code amount control precisely at the same time.

Means for Solving the Problems

A first aspect of the invention is to present a device for quantizing and coding input signals, that is, an encoding device in which an upper limit of a syirol amount of a binary symbol generated by quantization is specified.

The encoding device includes a signal processing circuit that processes an input signal in a predetermined method; a quantization parameter generating circuit that generates a first quantization parameter; a first quantizing circuit that generates first quantized data by quantizing the processed input signal on the basis of the first quantization parameter, a first binarizing circuit that binarizes the first quantized data to output first binary symbol data; a first arithmetic coding circuit that generates first coded data by arithmetic-coding the first binary symbol data on the basis of a predetermined target code amount; a quantization parameter calculating circuit that generates a second quantization parameter on the basis of a symbol amount of the first binary symbol data, a code amount of the first coded data, a second quantization parameter, an upper limit of the symbol amount, and the target code amount; a second quantizing circuit that generates second quantized data by quantizing the processed input signal on the basis of the second quantization parameter; a second binarizing circuit that binarizes the second quantized data to output second binary symbol data; and a second arithmetic coding circuit that generates and outputs coded data corresponding to the input signal by arithmetic-coding the second binary symbol data.

A second aspect of the invention is to present a method of quantizing and coding input signals, that is, an encoding method in which an upper limit of a symbol amount of a binary symbol generated by quantization is specified.

The encoding method includes the steps of: processing an input signal in a predetermined method; generating a first quantization parameter; generating first quantized data by quantizing the processed input signal on the basis of the first quantization parameter; binarizing the first quantized data to output first binary symbol data; generating first coded data by arithmetic-coding the first binary symbol data on the basis of a predetermined target code amount; generating a second quantization parameter on the basis of a symbol amount of the first binary symbol data, a code amount of the first coded data, a second quantization parameter, an upper limit of the symbol amount, and the target code amount; generating second quantized data by quantizing the processed input signal on the basis of the second quantization parameter; binarizing the second quantized data to output second binary symbol data; and generating and outputting coded data corresponding to the input signal by arithmetic-coding the second binary symbol data.

Effects of the Invention

According to the invention, in the encoding device using arithmetic coding, in a simple circuit configuration, the generated binary symbol amount is controlled under the upper limit, and the code amount of output bit stream can be controlled precisely at the same time, and the code amount is limited precisely within the specified amount, and the bit stream assured of decoding operation can be presented.

BRIEF DESCRIPTION OF DRAWINGS

FIG. 3A and FIG. 3B are diagrams showing a selection example of provisional quantization parameter.

FIG. 4A is a diagram for explaining a specific example of representative quantization parameter, FIG. 4B is a diagram showing an application example of representative quantization parameter in macro-block in the case of progressive system, and FIG. 4C is a diagram showing an application example of representative quantization parameter in macro-block in the case of interlacing system.

FIG. 5A and FIG. 5B are diagrams showing an application example of generated binary symbol amount and generated code amount in every representative quantization parameter to be stored in binary symbol amount and code amount integrated value memory.

FIG. 10A and FIG. 10B are diagrams for explaining binary arithmetic coding.

DESCRIPTION OF THE REFERENCE NUMERALS

Figure 1:
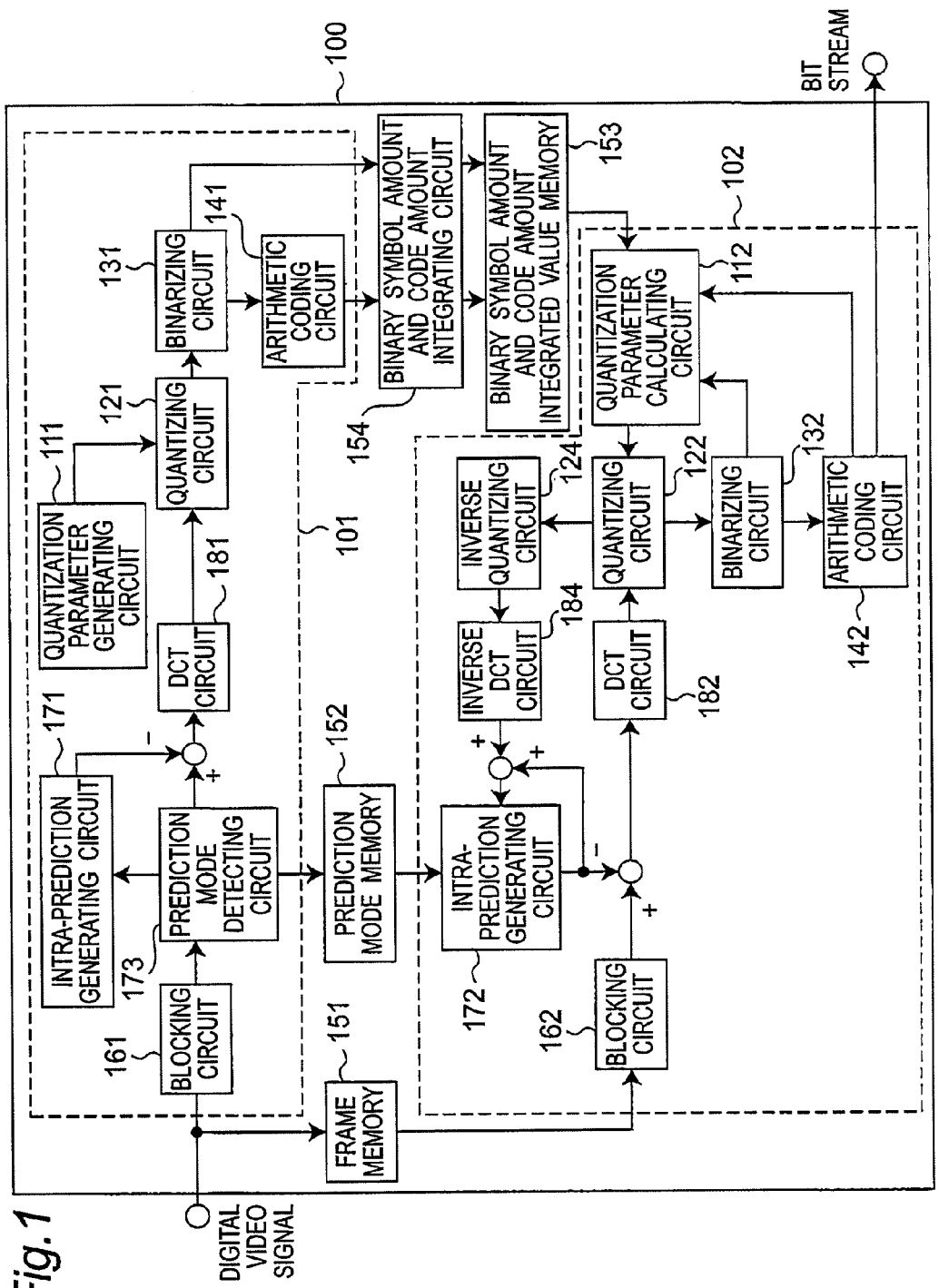
FIG. 1 is a configuration diagram of a video encoding device in an embodiment of the invention.

100 Video encoding device
101 First coding circuit
102 Second coding circuit
111 Quantization parameter generating circuit
112 Quantization parameter calculating circuit
121, 122 Quantizing circuit
124 Inverse quantizing circuit
131, 132 Binarizing circuit
131 Context selecting circuit
141, 142 Arithmetic coding circuit
151 Frame memory
152 Prediction mode memory
153 Binary symbol amount and code amount integrated value memory
161, 162 Blocking circuit
171, 172 Intra-prediction generating circuit
173 Prediction mode detecting circuit
181, 182 DCT circuit
184 Inverse DCT circuit
200 Encoding device
221, 222 Quantizing circuit
251 Delay memory
261 Signal processing circuit

BEST MODE FOR CARRYING OUT THE INVENTION

An embodiment of the invention is described below while referring to the accompanying drawings.

The embodiment relates to a video encoding device, for coding an intra-frame that can be decoded within a frame, capable of controlling the code amount precisely while controlling the binary symbol amount obtained by coding under a specified upper limit.

1. Configuration of Video Encoding Device

FIG. 1 shows a configuration of a video encoding device in an embodiment of the invention. In FIG. 1, a video encoding device 100 includes a first coding circuit 101 for performing a provisional coding, a second coding circuit 102 for performing a normal coding, a frame memory 151, a prediction mode memory 152, a binary symbol amount and code amount integrated value memory 153, and a binary symbol amount and code amount integrating circuit 154.

The first coding circuit 101 includes a blocking circuit 161 for dividing entered digital video signals into blocks, a prediction mode detecting circuit 173, an intra-prediction generating circuit 171, a DCT circuit 181 as orthogonal converting circuit, a quantizing circuit 121, a quantization parameter generating circuit 111, a binarizing circuit 131, and an arithmetic coding circuit 141.

The second coding circuit 102 includes a blocking circuit 162 for dividing entered digital video signals into blocks, an intra-prediction generating circuit 172, a DCT circuit 182, a quantizing circuit 122, a quantization parameter calculating circuit 112, a binarizing circuit 132, an arithmetic coding circuit 142, an inverse quantizing circuit 124, and an inverse DOT circuit 184.

2. Operation of Video Encoding Device

In the video encoding device having the configuration as explained above, its operation is explained. First of all, a flow of coding process on video data of one frame is described.

The video encoding device 100 receives digital video signals of one frame, and provisionally codes the video signals of one frame by the first coding circuit 101.

The digital video signals entered in the video encoding device 100 are also stored in the frame memory 151, are delayed by a specified time in one frame, and are output to the second coding circuit 102. The second coding circuit 102 reads out the data from the frame memory 151, performs normal coding of the read-out data, and outputs out a bit stream as coded result.

In the first coding circuit 101, the prediction mode detecting circuit 173 detects the prediction mode of intra-prediction, and stores the detected value in the prediction mode memory 152. The binary symbol amount and the code amount output from the binarizing circuit 131 and the arithmetic coding circuit 141 are stored in the binary symbol amount and code amount integrated value memory 153.

The second coding circuit 102 receives the prediction mode value stored in the prediction mode memory 152, and the integrated values of binary symbol amount and code amount stored in the binary symbol amount and code amount integrated value memory 153, and determines an optimum quantization parameter, and performs normal coding of the video signals of the same frame as the frame processed in the first coding circuit 101.

2.1 Processing by First Coding Circuit

The process of the first coding circuit 101 is explained.

The blocking circuit 161 divides the image shown by the entered digital video signals of one frame into a plurality of macro blocks of 16×16 pixels. The macro block includes a plurality of blocks as a processing unit of DCT or intra-prediction.

The intra-prediction generating circuit 171 predicts the values of pixels of the macro block in various prediction modes, from the pixels of entered digital video signals and pixels adjacent to pixels of entered digital video signals. The prediction mode includes field macro block decoding flag (mb_field_decoding_flag), luminance 4×4 intra-prediction mode (Intra4×4 PredMode), luminance 8×8 intra-prediction mode (Intra8×8 PredMode), and color difference intra-prediction mode (intra_chroma_pred_mode). The intra-prediction may be executed in the unit of 8×8 pixel block or 4×4 pixel block.

The prediction mode detecting circuit 173 detects the optimum prediction mode from the four prediction modes, and outputs its information as prediction mode value. The prediction mode value is accumulated in the prediction mode memory 152.

The difference value is calculated between each pixel value of the macro block to be coded in the entered digital video signals and prediction values of pixels of the macro block to be coded generated by the intra-prediction generating circuit 171, and a block of difference value of 16×16 pixels is generated and is output to the DCT circuit 181.

The DCT circuit 181 executes DCT processing on the block of difference value. DCT processing is carried out usually in the block unit of 4×4 pixels or 8×8 pixels, and the coefficient data of frequency component is output. The coefficient data is input into the quantizing circuit 121. The quantizing circuit 121 quantizes the coefficient data depending on the quantization parameter. The quantization parameter is given from the quantization parameter generating circuit 111.

The quantization parameter generating circuit 111 generates the quantization parameter for determining the quantizing rate in the quantizing process. In this embodiment, available values for quantization parameter range from 0 to 51, and the smaller value shows the higher quantizing rate. The quantization parameter generating circuit 111 has a plurality of quantization parameters (called representative quantization parameters) qp as candidates of quantization parameters to be generated. The quantization parameter generating circuit 111 selects one from a plurality of representative quantization parameters qp in every macro block, and outputs the selected representative quantization parameter as quantization parameter QP for quantizing of the macro block. The detail of the determining process of quantization parameter by the quantization parameter generating circuit 111 is specifically described later.

The coefficient data quantized by the quantizing circuit 121 is binarized in the binarizing circuit 131, and is arithmetically coded in the arithmetic coding circuit 141. The binary symbol amount and code amount integrating circuit 154 integrates the symbol amount of the binary symbol output from the binarizing circuit 131 and the code amount of the codes output from the arithmetic coding circuit 141, in every macro block group in which the same quantization parameter is applied, and stores the integrated values in the binary symbol amount and code amount integrated value memory 153.

In this embodiment, in provisional coding, prediction pixels of intra-prediction are obtained from digital video signals. Prediction pixels of intra-prediction specified by H.264 standard are decoded values used in the decoder, but it is advised not to use them because of the following reasons.

First, in provisional coding, the quantization parameter is changed in the quantization parameter generating circuit 111, and the code amount and the binary symbol amount are output, and if decoded pixels are used, therefore, the precision of decoded pixels is poor when the value of the quantization parameter is large, and the precision of prediction pixels in the subsequent macro blocks is declined. Second, without using decoded pixels, the inverse quantizing circuit and inverse DCT circuit in the provisional coding process can be omitted, and the circuit scale is reduced.

2.2 Processing by Second Coding Circuit

The process of the second coding circuit 102 is explained.

When provisional coding of one frame is finished by the first coding circuit 101, video signals of one frame acculated in the frame memory 151 are entered into the blocking circuit 162 of the second coding circuit 102. The blocking circuit 162 divides the image of video signals of one frame into a plurality of macro blocks of 16×16 pixels.

The intra-prediction generating circuit 172 reads out a prediction mode value from the prediction mode memory 152, and determines the pixel prediction value about each pixel in the macro block to be coded by using the prediction mode shown by the prediction mode value. At this time, the values of adjacent pixels used in intra-prediction by the intra-prediction generating circuit 172 are generated by the inverse quantizing circuit 124 and the inverse DCT circuit 184. The intra-prediction generating circuit 172 calculates the difference value between the pixel prediction value and the pixel value in the macro block to be coded in every pixel, and determines the block of the difference value.

The DCT circuit 182 executes DCT processing on the block of the obtained difference value, and outputs the coefficient data of the frequency component. The coefficient data is input into the quantizing circuit 122.

The quantizing circuit 121 quantizes the coefficient data depending on the quantization parameter. The quantization parameter is calculated in the quantization parameter calculating circuit 112. The quantizing circuit 121 outputs the quantized coefficient parameter to the binarizing circuit 132 and the inverse quantizing circuit 124.

The quantization parameter calculating unit 112 acquires the binary symbol amount and code amount determined in the first coding circuit 101 from the binary symbol amount and code amount integrated value memory 153, and determines the quantization parameter on the basis of these values. The detail of the quantization parameter generating circuit 112 is specifically described below.

The binarizing circuit 132 converts the quantized coefficient data into binary symbol. The arithmetic coding circuit 142 arithmetically codes the binary symbol from the binarizing circuit 132, and outputs the result as bit stream. Herein, in the arithmetic coding circuit 142, the target code amount is defined to show the upper limit of the generated code amount.

On the other hand, the coefficient data quantized by the quantizing circuit 122 is quantized inversely by inverse quantizing circuit 124, and processed by the inverse DCT in the inverse DCT circuit 184. As a result, the value of adjacent pixel of macro block to be coded used in intra-prediction is obtained.

2.3 Operation of Quantization Parameter Generating Circuit in First Coding Circuit The following is the explanation about generation operation of quantization parameter by the quantization parameter generating circuit 111 of the first coding circuit 101. In the following explanation, in provisional coding of one frame of 1920×1080 pixels, calculation of quantization parameter optimum for slice unit is explained. The slice of dividing the frame is defined as a set of arbitrary continuous macro blocks.

Figure 2A:
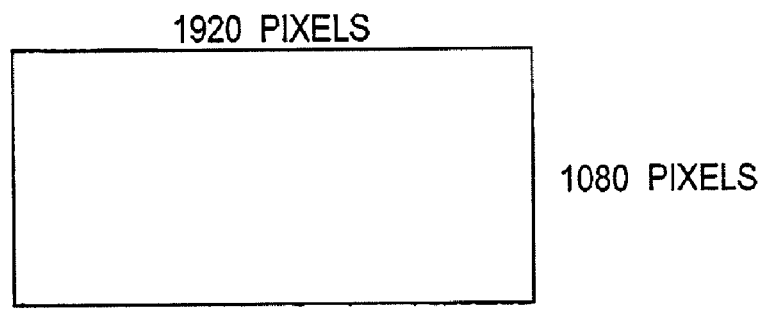
FIG. 2A and FIG. 2B are diagrams for explaining the relation between the image to be coded and macro block.
Figure 2B:
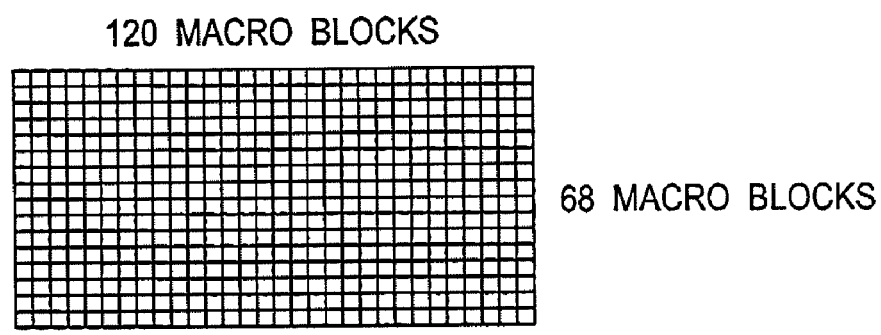

As shown in FIGS. 2A and 2B, a frame of 1920×1080 pixels is composed of 8160 (=120×68) macro blocks each of which has 16×16 pixels. In this embodiment, one slice contains 2040 macro blocks, and one frame is composed of four slices.

Before start of provisional coding, provisional quantization parameter $QP_1$ (n) used in the quantizing circuit 121 of the first coding circuit 101 is determined. The provisional quantization parameter $QP_1$ (n) is set to one parameter selected from a plurality of parameter candidates (representative quantization parameters) in every macro block. That is, the provisional quantization parameter $QP_1$ (n) corresponding to one macro block is set to one provisional quantization parameter $qp_1$ (m) selected from arbitrary different Q types of representative quantization parameters $qp_1$ (x) (x=0, 1, ..., Q-1). The representative quantization parameters are determined so as to contain the maximum value and minimum value of the specified quantization parameter.

For example, it is supposed to give two types of representative quantization parameters 0 and 20, $qp_1$ (x)={0, 20}. Herein, the notation of F(x)={$A_0, A_1, ..., A_{Q-1}$} (A being an integer) means F(0)=$A_0$, F(1)=$A_1$, ..., F(Q-1)=$A_{Q-1}$. Provisional quantization parameters of each macro block are selected from two types of representative quantization parameters so that the occurrence frequency of each representative quantization parameter may be equal. In this example, quantization parameter "0" is given in half macro blocks, and quantization parameter "20" is given in remaining half macro blocks. To prevent the provisional quantization parameters from being lopsidedly inclined within the slice, provisional quantization parameters are disposed alternately or randomly in the slice. In progressive scanning, for example, as shown in FIG. 3A, representative quantization parameters are given alternately in ordinary raster scan sequence, and in the interlace scanning, as shown in FIG. 3B, representative quantization parameters can be given alternately in every pair of macro blocks.

The following is the explanation about the determining method of number Q of representative quantization parameters $qp_1$ (x) (x=0, 1, ..., Q-1) in provisional coding process and each value $qP_1$ (x).

The number Q of representative quantization parameters used in the quantizing circuit 121 can be set to a divisor of the number of macro blocks contained in one slice. In this method, when the number Q of representative quantization parameters is determined, the number of times of occurrence of each representative quantization parameter in the slice can be set constant. At this time, when the scanning system is progressive system, the divisor of the number of macro blocks can be selected as the number Q of representative quantization parameters. Or, when using macro blocks in pair for the purpose of coding by interlace system, the divisor can be set to half the number of macro blocks contained in one slice. For example, when the number of macro blocks contained in one slice is 2040, the number Q of representative quantization parameters may be selected from 5, 10, and 20. In each value of Q, the number of times of occurrence of each representative quantization parameter in one slice is 408 times, 204 times, and 102 times, respectively.

As representative quantization parameter $qp_1$ (x), Q pieces of different values are selected from the range of quantization parameters that can be selected by the encoder. In this case, preferably, these values should be distributed appropriately so that the code amount may be predicted easily for optimum coding.

For example, when the number of macro blocks contained in one slice is 2040, quantization parameters that can be selected from the encoder are in a range from 0 to 51, as representative quantization parameters $qp_1$, as shown in FIG. 4A, ten representative quantization parameters can be selected, that is, {0, 4, 8, 12, 16, 22, 28, 34, 42, 51}. At this time, the representative quantization parameters can be applied as shown in FIG. 4B in the case of progressive system, and the representative quantization parameters can be applied as shown in FIG. 4C in the case of interlace system.

2.4 Operation of Binary Symbol Amount and Code Aunt Integrating Circuit

The binary symbol amount and code amount integrating circuit 154 integrates, respectively, the binary symbol amount and code amount obtained as a result of provisional coding in the first coding circuit 101, in every block by using the same representative quantization parameter, and stores the respective integrated values in the integrated value memory 153. The operation is specifically described below.

In provisional coding process by the first coding circuit 101, in one slice containing 2040 macro blocks, the sum of generated binary symbol amount $B_1$ (n) and generated code amount $R_1$ (n) is calculated in every macro block using the same representative parameter $gp_1$ (x). The sum is accumulated in the binary symbol amount and code amount integrated value memory 153 as every-QP generated binary symbol amount $b_1$ (x) and every-QP generated code amount $r_1$ (x).

For example, in each one of representative quantization parameters $qp_1$ (x) shown in FIG. 5A, as shown in FIG. 5B, the every-QP generated symbol amount $b_1$ (x) calculating the sum of binary symbol amounts $B_1$ (n) in each representative quantization parameter, and the every-QP generated code amount $r_1$ (x) calculating the sum of generated code amounts $R_1$ (n) in each representative quantization parameter are accumulated in the binary symbol amount and code amount integrated value memory 153.

Figure 6:
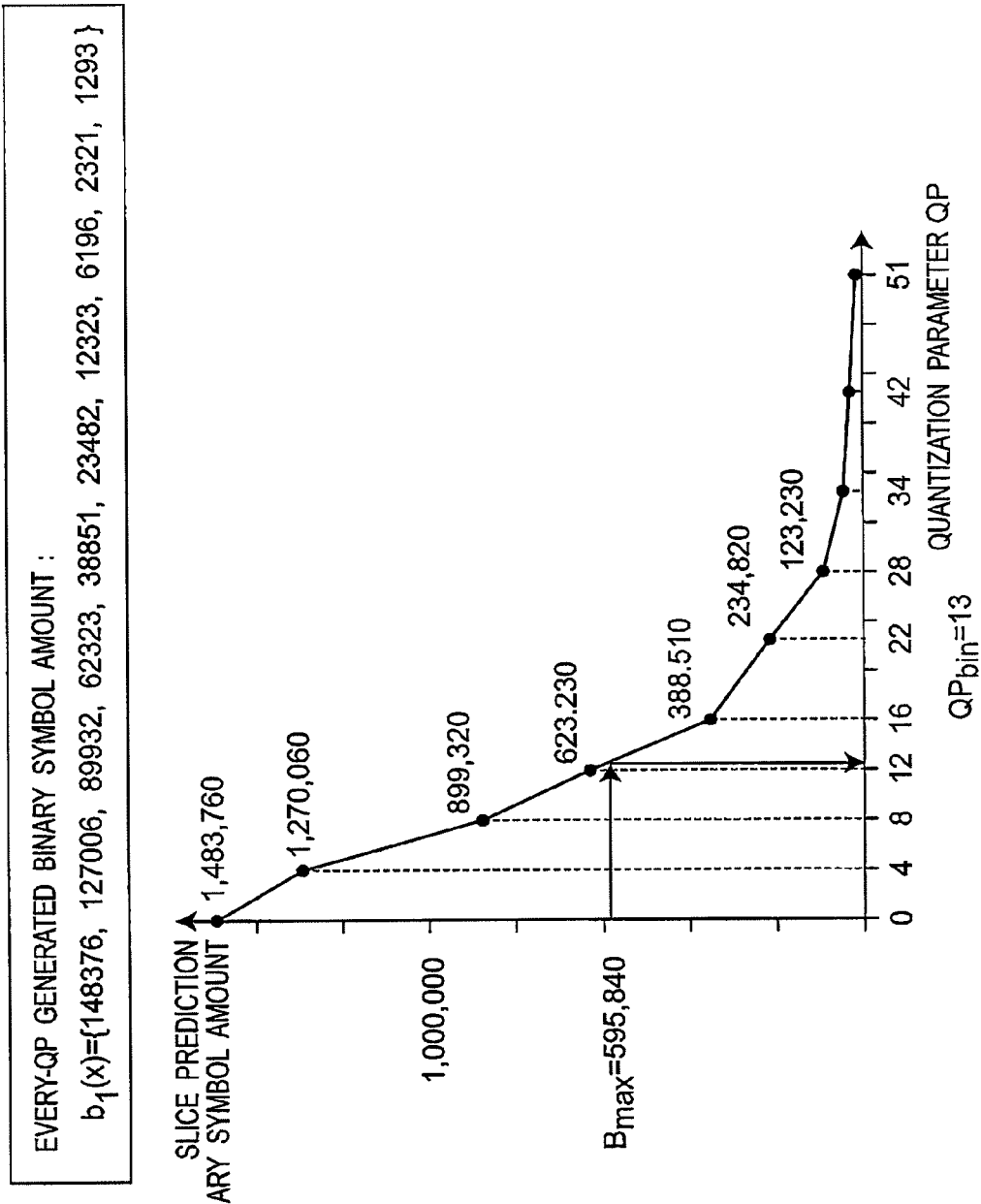
FIG. 6 is a diagram for explaining a calculating method of optimum quantization parameter on the basis of generated binary symbol amount.
Figure 7:
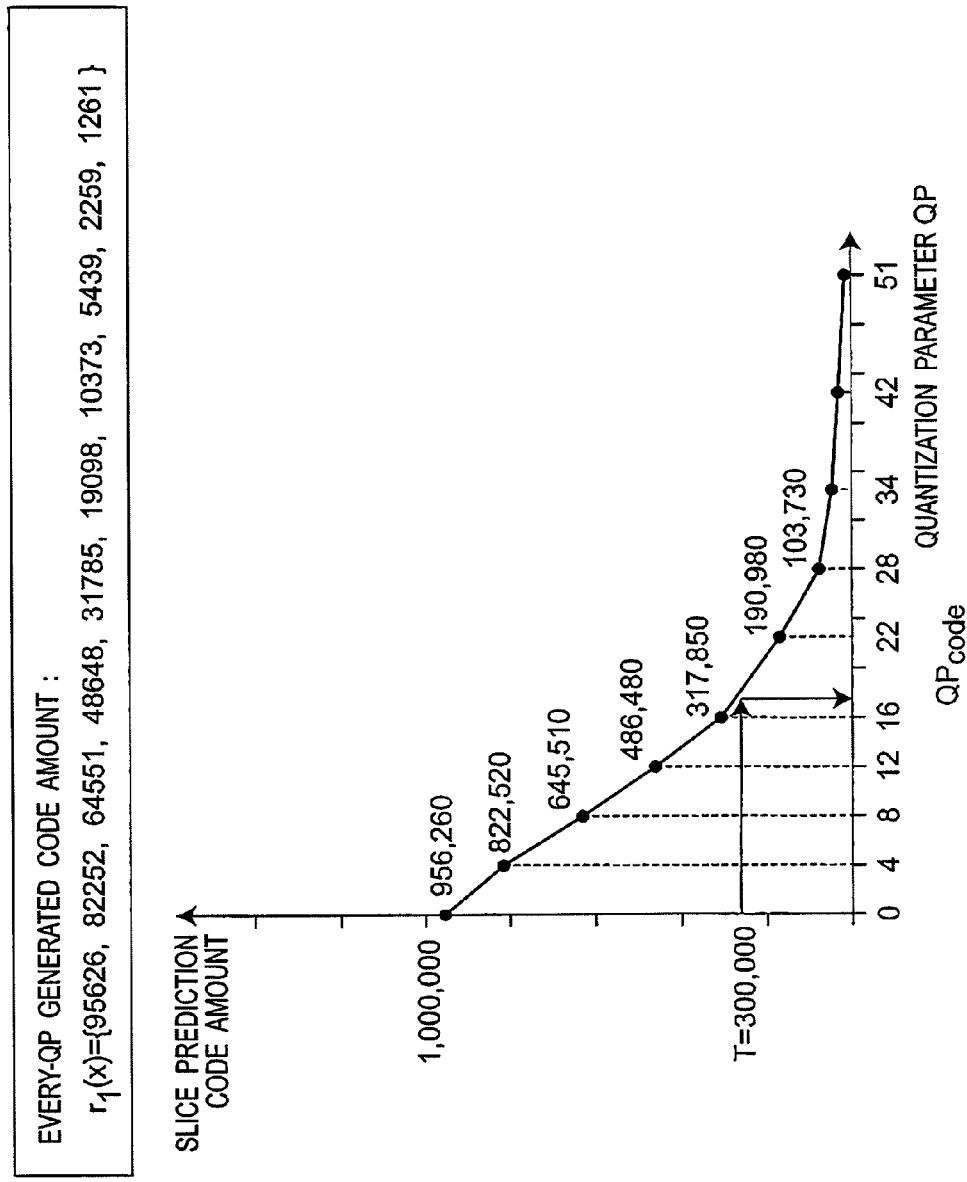
FIG. 7 is a diagram for explaining a calculating method of optimum quantization parameter on the basis of generated code amount.

2.5 Operation of Quantization Parameter Generating Circuit in Second Coding Circuit The calculation method of optimum quantization parameter $QP_{opt}$ applied in coding in the second coding circuit 102 is explained by referring to FIG. 6 and FIG. 7. Herein, target code amount T and upper limit binary symbol amount B of the slice assigned by using the information such as bit rate, frame rate, frame complicatedness, and slice coding type are set as follows.

Target code amount of slice T=300,000 bits
Upper limit binary symbol amount $B_{max}$=595,840 bits The second coding circuit 102 determines the optimum quantization parameter $QP_{opt}$ on the basis of generated symbol amount $b^1$ (x) and generated code amount $r_1$ (x) in each representative quantization parameter obtained as a result of provisional coding in the first coding circuit 101, upper limit binary symbol amount, and target code amount. Specifically, the quantization parameter calculating circuit 112 calculates the optimum quantization parameter on the basis of the binary symbol amount, and calculates the optimum quantization parameter on the basis of the code amount, and compares, the calculated results, and selects the greater quantization parameter as the optimum quantization parameter. The detail is described below.

First, referring to FIG. 6, calculation of optimum quantization parameter candidate Qi on the basis of binary symbol amount is explained. FIG. 6 is a diagram explaining the relation of quantization parameter QP and binary symbol amount predicted in slice unit, on the basis of representative quantization parameter $qp_1$ (x) and generated binary symbol amount $b_1$ (x) in each and every quantization parameter QP.

The generated binary symbol amount $b_1$ (x) according to every QP is determined by calculating the sun of binary symbol amounts in the macro blocks in which the same quantization parameter QP is applied, in each quantization parameter QP (=x). Since each quantization parameter is applied in 204 macro blocks, $b_1$ (x) is the sum of binary symbol amounts of every 204 macro blocks. The prediction code amount of slice unit corresponding to each quantization parameter QP is determined by multiplying $b_1$ (x) by 10 times.

In FIG. 6, by linear interpolation of prediction binary symbol amounts in the plotted slice units, the slice prediction binary symbol amount in relation to all QP values (0≦QP≦51) can be calculated. That is, for the upper limit binary symbol amount $B_{max}$ (=595840) of slice, by linear interpolation by using the relation shown in FIG. 6, the optimum quantization parameter $QP_{bin}$ capable of settling the generated binary symbol amount less than or equal to the upper limit binary symbol amount can be obtained. The optimum quantization parameter QPF can be obtained in the following formula.

$$QP_{bin}=CEIL[q+\{QP_1(q+1)-QP_1(q)\}*\{Q*b_1(q)-B_{max}\}/\{Q*b_1(q)-Q*b_1(q+1)\}] \quad (1)$$

where CEIL [x] is a function for returning a minimum integer equal to or larger than x, and q is an integer satisfying the relation of 0≦q≦Q-1, more specifically satisfying the relation of $Q \times b_1$ (q+1)≦$B_{max}$≦$Q \times b_1$ (q). Herein, throughout one slice, one optimum quantization parameter is used. Specifically, q=0 if $B_{max}$>$Q \times b_1$ (q) in all q, and q=Q-1 if $B_{max}$<$Q \times b_1$ (q) in all q. Accordingly, the provisional quantization parameter is preferred to be set previously as $QP_1$ (0)=min (QP)=0, $QP_1$ (Q-1)=max (QP)=51.

In the case of $B_{max}$=595840, according to formula (1), the optimum quantization parameter candidate QP is determined to be 13.

$$QP_{bin} = CEIL\left[\frac{12+(16-12)\times}{(623230-595840)/(623230-388510)}\right] = 13$$

Referring now to FIG. 7, calculation of the optimum quantization parameter candidate $QP_{code}$ on the basis of code amount is explained below. FIG. 7 is a diagram showing the relation of quantization parameter QP and slice prediction code amount, on the basis of representative quantization parameter $qp_1$ (x) and generated code amount $r_1$ (x) of every quantization parameter QP.

The generated code amount $r_1$ (x) in every QP is the sum of code amounts of macro blocks in which the same quantization parameter QP is applied, determined in every quantization parameter QP (=x). Each quantization parameter is applied to 204 macro blocks, and $r_1$ (x) is the sum of code amounts of every 204 macro blocks. The slice prediction code amount for each quantization parameter QP is determined by multiplying $r_1$ (x) by 10 times.

In FIG. 7, by linear interpolation of the plotted slice prediction code amount, the slice prediction code amount on all QP values (0≦QP≦51) can be calculated. That is, for the target code amount of the slice T=300,000, by linear interpolation by using the relation of FIG. 6, the optimum quantization parameter candidate $QP_{code}$ for determining the generated code amount as the target code amount can be obtained. Calculation of $QP_{code}$ is executed in the following formula by linear interpolation.

$$QP_{code}=q+\{QP_1(q+1)-QP_1(q)\}*\{Q*r_1(q)-T\}/\{Q*r_1(q)-Q \times r_1(q+1)\} \quad (2)$$

where q is an integer defined in 0≦q≦Q-1, satisfying the relation of $Q \times r_1$ (q+1)≦T≦$Q \times r_1$ (q). Herein, one optimum quantization parameter is used throughout one slice. Also, q=0 if T>$Q \times r_1$ (q) is established in all cases of q, or q=Q-1 if T<$Q \times r_1$ (q) is established in all cases of q.

By using formula (2), the optimum quantization parameter candidate $QP_{code}$ is calculated, and about 16.84 is obtained, but since the optimum quantization parameter must be an integer, 17 is obtained by rounding off.

$$QP_{code} = 16 + (22-16) \times (317850 - 300{,}000) /$$
$$(317850 - 190980) \approx 16.84$$
$$= \approx 17$$

The quantization parameter calculating circuit 112 selects the larger one of optimum quantization parameter candidate $QP_{bin}$ on the basis of the obtained binary symbol amount and optimum quantization parameter candidate $QP_{code}$ on the basis of the code amount, and outputs the selected one as optimum quantization parameter candidate QPq into the quantizing circuit 122.

In FIG. 6 and FIG. 7, $QP_{bin}=13$ and $QP_{code}=17$, and $QP_{opt}=17$ is selected. Thus, the greater one of $QP_{bin}$ and $QP_{code}$ is selected as the optimum quantization parameter $QP_{opt}$, and hence coding depending on the statistical nature of input data is possible, and the generated code amount can be suppressed low. In other words, when the binary symbol value is relatively larger and the code amount is smaller, $QP_{bin}$ is selected, and the upper limit of the binary symbol amount is satisfied although the code amount is slightly smaller than the target code amount. To the contrary, when the binary symbol amount is relatively smaller and the code amount is larger, $QP_{code}$ is selected, and the binary symbol amount is suppressed somewhat smaller than the upper limit, and coding closer to the target code amount is realized.

3. Summary

As explained herein, according to the video encoding device of the embodiment, in provisional coding by the first coding circuit 101, first, the generated binary symbol amount and the generated code amount are determined in each one of the plurality of representative quantization parameters. Then, in the second coding circuit 102, on the basis of the values determined in provisional coding, optimum quantization parameters are determined in consideration of upper limit binary symbol amount and target code amount. By this method, the optimum quantization parameter can be determined in the flow of process in one direction, and unlike the prior art, complicated circuit configuration for returning the updated arithmetic coding occurrence probability information to the original data is not needed, and parallel connection of arithmetic coding circuits is not needed, and the circuit configuration is simple.

According to the embodiment, the generated code amount can be suppressed less than or equal to specified amounts while suppressing the binary symbol amount obtained by coding less than or equal to specified upper limit. Hence, the video encoding device of the embodiment is particularly effective when the code amount of the frame unit is desired to be constant. For example, the video encoding device of the embodiment is effective in the case of coding while the code amount of frame unit is limited, in the case of coding while the code amount of frame unit is not limited, or in the case of coding while the code amount of present frame is limited in the critical decoder buffer state. The reasons are explained below.

Suppose, contrary to the concept of the embodiment, that the binary symbol amount is over the specified upper limit, and that only the code amount is suppressed equal to or under limit values. In this case, according to the encoding method of non-patent document 1, by increasing the code amount by using stuffing called cabac_zero_word, it is required to abide by the regulation of upper limit of binary symbol amount. However, by increasing the code amount, the code amount exceeds the limit, and coding may be broken down. In the embodiment, since the binary symbol amount can be controlled equal to or under the upper limit values of the binary symbol amount calculated in relation to the limit values, if stuffing of cabac_zero_word is needed, the code amount always remains within the limit, and coding is not broken down. Hence, the concept of the embodiment is particularly effective in such case.

(Modified Examples)

In the embodiment, fixed values are given as optimum quantization parameter $QP_{opt}$, but alternatively, for example, $QP_{opt}$ may be used as initial value for coding of N macro blocks, and the subsequent quantization parameters may be used to control the binary symbol amount and the code amount by feedback control, and the optimum quantization parameter $QP_2$ (n) can be dynamically changed. The feedback control can be executed, for example, in the case of control on the basis of code amount, by setting the remaining code amount (T−B), which is the difference between cumulative generated code amount B of summing the generated code amount $R_2$ (n) in coding in a range of $0 \leq n \leq m$, in macro block of macro block number m, and target code amount T up to a certain point (for example, up to macro block number N−1), to the target code amount S of remaining macro blocks n ($m<n\leq N-1$). It is also possible to change the quantization parameter $QP_2$ (n) dynamically on the basis of luminance value or color difference value of macro blocks, or feature quantities in the frequency region.

In the embodiment, provisional coding and normal coding are executed in the slice unit, but provisional coding and normal coding may be executed in smaller units, and the generated code amount $R_2$ (n) may be obtained. When the result is reflected in selection of quantization parameter, or when feedback control is executed in smaller units, it is also effective when executed in several macro blocks or smaller units. The processing unit of provisional coding and normal coding is fixed, but the processing unit of provisional coding and normal coding may be dynamically changed in frame units or other units. The slice prediction code amount is determined by linear interpolation, but spline interpolation or other advanced numerical interpolation may be also applicable.

In the embodiment, the generated binary symbol amount $b_1$ (x) of every QP, and the generated code amount $r_1$ (x) of every QP are accumulated in the binary symbol amount and code amount integrated value memory 153, but the generated binary symbol amount $B_1$ (n) and generated code amount $R_1$ (n) in every macro block before calculation of sum may be accumulated, and the sum may be calculated after reading out from the binary symbol amount and code amount integrated value memory 153.

In the embodiment, provisional coding process is executed only once, but if real-time coding process is not necessary, or if multiple processes may be executed in a specific delay by performing provisional coding process in pipeline or parallel arrangement, provisional coding process may be executed plural times.

In the embodiment, video coding of H.264 standard is explained according to context adaptive binary arithmetic coding. However, the concept of the invention may be applied in arithmetic coding of quantized coefficient data, and can be applied in an encoding device capable of changing the quantization parameter adaptively.

Figure 8:
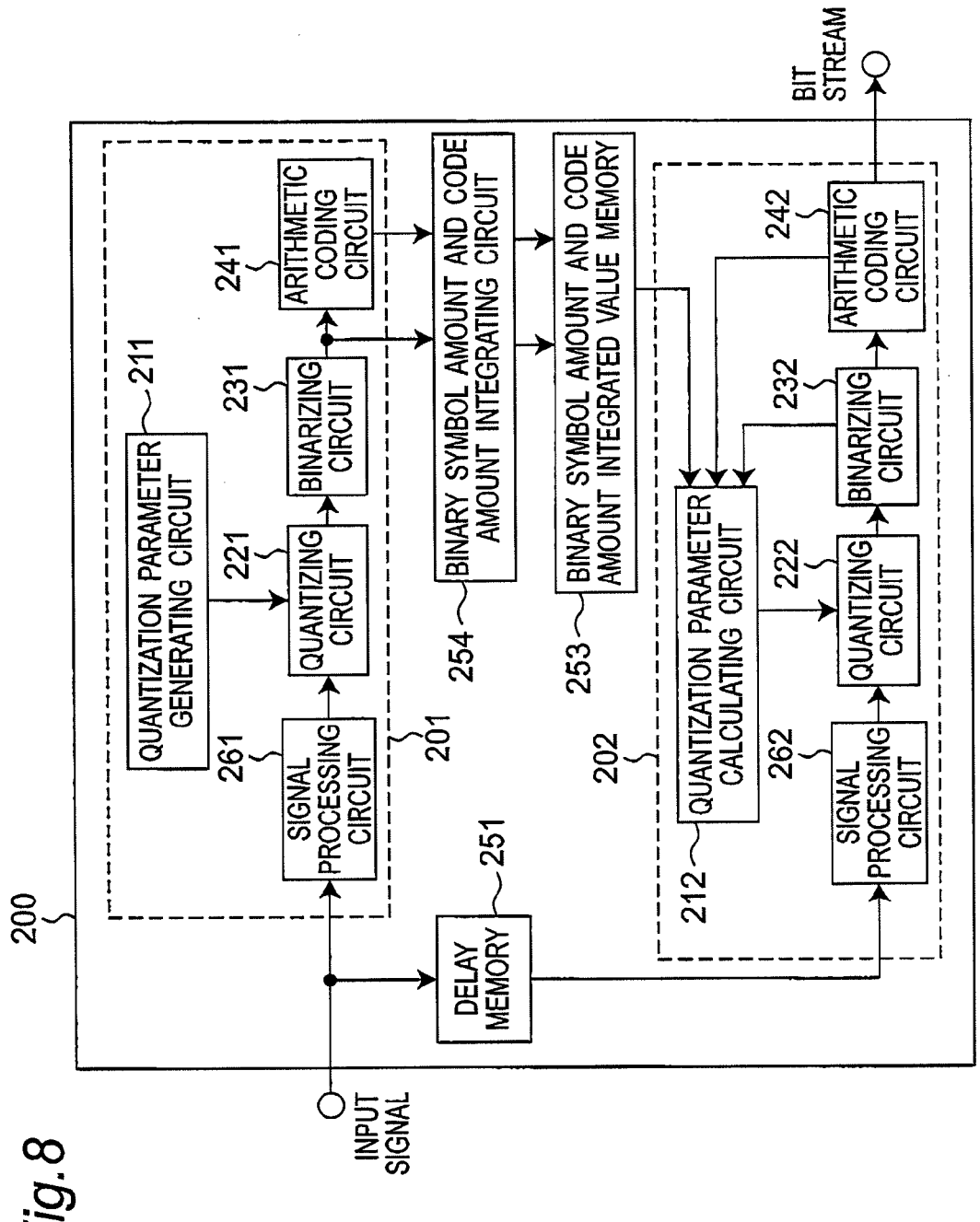
FIG. 8 is a block diagram of an encoding device in which the concept of the invention is applicable.
Figure 9:
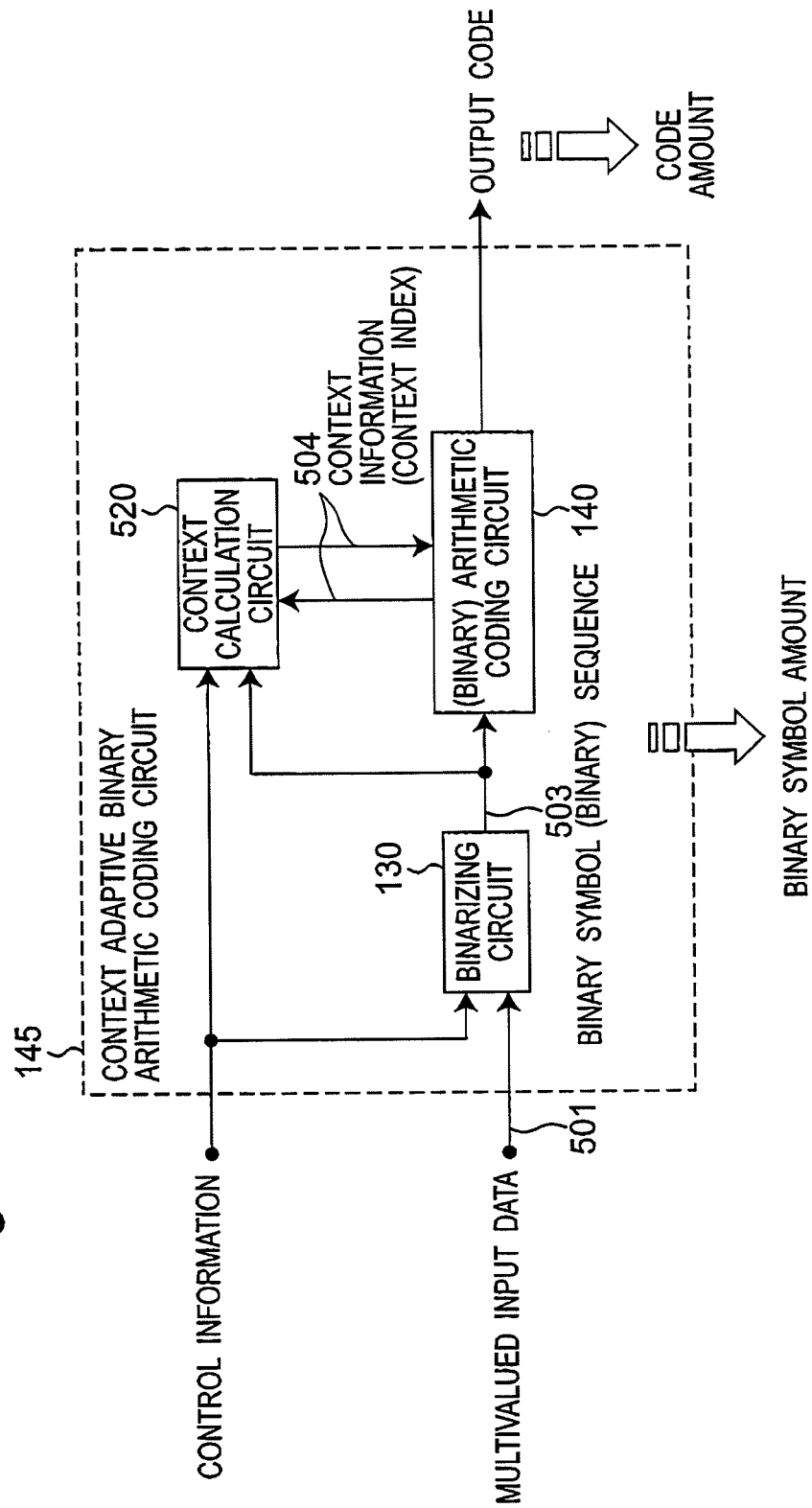
FIG. 9 is a diagram showing a configuration of a conventional context adaptive arithmetic coding circuit.

For example, it is applicable to an encoding device as shown in FIG. 8. In FIG. 8, an encoding device 200 includes a first coding circuit 201 for coding the input signal provisionally, a second coding circuit 202 for coding normally, a delay memory 151 for delaying the input signal, a binary symbol amount and code amount integrated value memory 253, and a binary symbol amount and code amount integrating circuit 254.

The first coding circuit 201 includes a signal processing circuit 261 for processing the input signal in a predetermined method, a quantizing circuit 221, a quantization parameter generating circuit 211, a binarizing circuit 231, and an arithmetic coding circuit 241.

The second coding circuit 202 includes a signal processing circuit 262 for processing the input signal in a predetermined method, a quantizing circuit 222, a quantization parameter calculating circuit 212, a binarizing circuit 232, and an arithmetic coding circuit 242.

The encoding device 200 having such configuration operates as follows in provisional coding process. The signal processing circuit 261 processes the input signal as prescribed, and the quantizing circuit 221 quantizes the signal output from the signal processing circuit 261 on the basis of the provisional quantization parameter from the quantization parameter generating circuit 211. The quantized signal is binarized in the binarizing circuit 231, and is then coded arithmetically in the arithmetic coding circuit 241. The binary symbol amount and code amount integrating circuit 254 integrates the symbol amount of binary symbol output from the binarizing circuit 231 and the code amount of the code output from the arithmetic coding circuit 241, in every specified unit, and the integrated values are stored in the binary symbol amount and code amount integrated value memory 253. The operation of the binary symbol amount and code amount integrating circuit 254 is as mentioned above.

Later, normal coding process is executed by the second coding circuit 202. The signal processing circuit 262 processes the input signal delayed by a specific time in the delay memory 251 in a predetermined method. The quantizing circuit 222 quantizes the processed input signal, by using the quantization parameter output from the quantization parameter calculating circuit 212. The determining method of quantization parameter in the quantization parameter calculating circuit 212 is as explained earlier. Finally, a bit stream is output after processing in the binarizing circuit 232 and arithmetic coding circuit 242.

In this embodiment, too, the coded bit stream is recorded in a recording medium such as tape, optical disk, magnetic disk, or semiconductor memory, and can be distributed again.

The functions of the circuits in the encoding device in FIG. 1 and FIG. 8 can be realized in the software, and by running the software by microprocessor, the same function as the encoding device in FIG. 1 and FIG. 8 can be realized.

Industrial Applicability

The invention is particularly effective in a data recording apparatus such as a digital camera recorder and a video recording device in which real-time operation is demanded in a small circuit size.

Although the present invention has been described in connection with specified embodiments thereof, many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2006-319981, filed on Nov. 28, 2006, which is expressly incorporated herein by reference in its entirety.

The invention claimed is:

1. An encoding device that quantizes and codes input signals in which an upper limit of a symbol amount of a binary symbol generated by quantization is specified, comprising:
   a signal processing circuit that processes an input signal in a predetermined method;
   a quantization parameter generating circuit that generates a first quantization parameter;
   a first quantizing circuit that generates first quantized data by quantizing the processed input signal on the basis of the first quantization parameter,
   a first binarizing circuit that binarizes the first quantized data to output first binary symbol data;
   a first arithmetic coding circuit that generates first coded data by arithmetic-coding the first binary symbol data on the basis of a predetermined target code amount;
   a quantization parameter calculating circuit that generates a second quantization parameter on the basis of a symbol amount of the first binary symbol data, a code amount of the first coded data, a second quantization parameter, an upper limit of the symbol amount, and the target code amount;
   a second quantizing circuit that generates second quantized data by quantizing the processed input signal on the basis of the second quantization parameter;
   a second binarizing circuit that binarizes the second quantized data to output second binary symbol data; and
   a second arithmetic coding circuit that generates and outputs coded data corresponding to the input signal by arithmetic-coding the second binary symbol data.

2. The encoding device according to claim 1, wherein the quantization parameter calculating circuit:
   generates a first parameter candidate on the basis of the first quantization parameter, the symbol amount of the first binary symbol data, and the upper limit of the symbol amount,
   generates a second parameter candidate on the basis of the first quantization parameter, the code amount of the first coded data, and the target code amount, and
   compares the first parameter candidate with the second parameter candidate, and sets, to the second quantization parameter, one of the first and second parameter candidates such that the code amount of the coded data to be generated is smaller.

3. The encoding device according to claim 1, wherein the quantization parameter generating circuit has a plurality of representative quantization parameters, and selects one representative parameter from the plurality of representative quantization parameters as the first quantization parameter.

4. The encoding device according to claim 3, wherein the signal processing circuit processes the input signal in a predetermined method, and generates N signals (N being 2 or larger natural number), and the number Q of the plurality of representative quantization parameters is a divisor of N, and
   the quantization parameter generating circuit generates the first quantization parameter by assigning the continuous Q signals output from the signal processing circuit with the mutually different Q representative quantization parameters.

5. The encoding device according to claim 3, wherein the plurality of representative quantization parameters include a maximum value and a minimum value of quantization parameters.

6. The encoding device according to claim 1, wherein the signal processing circuit receives a video signal, generates coefficient data by converting the video signal into a frequency component, and outputs the coefficient data.

7. The encoding device according to claim 6, wherein the signal processing circuit generates the coefficient data, in each block obtained by dividing one frame of a video image into a plurality of blocks, on the basis of pixels contained in the block and pixels adjacent to the block, and the signal processing circuit extracts the adjacent pixels used in generation of coefficient data to be entered in the first quantizing circuit from the entered video signal, and extracts the adjacent pixels used in generation of coefficient data to be entered in the second quantizing circuit from the signal inversely quantized from the second quantized data and inversely converted from the frequency component.

8. The encoding device according to claim 7, wherein the quantization parameter calculating circuit generates a second quantization parameter by using the result of integrating, in every the same first quantization parameters, the symbol amount of the first binary symbol data in a specified number of blocks, and the result of integrating, in every the same first quantization parameters, the code amount of the first coded data in a specified number of blocks.

9. An encoding method that quantizes and codes input signals in which an upper limit of a symbol amount of a binary symbol generated by quantization is specified, comprising:

processing an input signal in a predetermined method;

generating a first quantization parameter;

generating first quantized data by quantizing the processed input signal on the basis of the first quantization parameter;

binarizing the first quantized data to output first binary symbol data;

generating first coded data by arithmetic-coding the first binary symbol data on the basis of a predetermined target code amount;

generating a second quantization parameter on the basis of a symbol amount of the first binary symbol data, a code amount of the first coded data, a second quantization parameter, an upper limit of the symbol amount, and the target code amount;

generating second quantized data by quantizing the processed input signal on the basis of the second quantization parameter;

binarizing the second quantized data to output second binary symbol data; and generating and outputting coded data corresponding to the input signal by arithmetic-coding the second binary symbol data.

* * * * *